United States Patent

[11] 3,602,775

[72] Inventors Willem Baas Stadskanaal; Meindert Johan Tegel, Stadskanaal; Hendrik Bertus Kerkmeester, Emmasingel, Eindhoven, all of, Netherlands
[21] Appl. No. 810,994
[22] Filed Mar. 27, 1969
[45] Patented Aug. 31, 1971
[73] Assignee U.S. Philips Corporation New York, N.Y.
[32] Priority Apr. 2, 1968
[33] Netherlands
[31] 6804572

[54] SEMICONDUCTOR DEVICE INCLUDING A CIRCUIT ARRANGEMENT OF DIODES
2 Claims, 4 Drawing Figs.

[52] U.S. Cl. 317/101 CW, 174/52 PE
[51] Int. Cl. H05k 1/04
[50] Field of Search 317/101, 101 CC, 101 CW, 323, 234; 176/52.6; 29/626; 264/272

[56] References Cited

UNITED STATES PATENTS

| | | | |
|---|---|---|---|
| 2,477,653 | 8/1949 | Roane | 317/101 CC (UX) |
| 2,911,572 | 11/1959 | Francis et al. | 317/101 CW (UX) |
| 2,939,095 | 5/1960 | Chertok | 174/52.6 (UX) |
| 3,164,749 | 1/1965 | Berge et al. | 174/52.6 (UX) |
| 3,249,827 | 5/1966 | Benda et al. | 317/234 UX |
| 3,359,360 | 12/1967 | Owings | 174/52.6 (UX) |

*Primary Examiner*—David Smith, Jr.
*Attorney*—Frank R. Trifari

ABSTRACT: A package for plural diodes forming a rectifier circuit is described. The package includes terminals formed by plural rigid leads some of whose ends inside the encapsulation have bends to provide adequate spacing to accommodate the diodes. Some leads may have curved parts providing underpasses for diode supply leads. The leads without bends have protuberances. The package lends itself to automatic assembly.

INVENTOR.
WILLEM BAAS
MEINDERT J. TEGEL
HENDRIK B. KERKMEESTER
BY
AGENT

SEMICONDUCTOR DEVICE INCLUDING A CIRCUIT ARRANGEMENT OF DIODES

The invention relates to a semiconductor device including a circuit arrangement of diodes, for example a Gratz rectifier circuit, which diodes are enclosed in an envelope of synthetic plastics material, the semiconductor device having a plurality of electrically conducting leadout wires protruding from the envelope to the exterior, which wires are mainly coplanar and protrude on one side from the envelope to the exterior in parallel with one another.

In such commercially available semiconductor devices which are of the Gratz rectifier circuit type, two silicon crystals are secured to each of two comparatively large and thick metal mounting plates. Furthermore, a leadout wire is secured to each plate, while one wire is soldered to every two crystals provided on different mounting plates. Subsequently an Si-rubber insulation is provided over the crystals, this assembly subsequently being introduced in a boxlike housing, which is then filled up with a synthetic plastics material.

The manufacture of such semiconductor devices is expensive. The mounting plates consist of comparatively large copper plates which is necessary since these mounting plates which are completely incorporated in synthetic plastics material must ensure a sufficient thermal conduction. The structure of these semiconductor devices requires many work-hours and is not suitable for mechanization. If one of the four crystals is damaged, the entire finished product will be unsuitable. Since the quality of the crystals in this structure can be thoroughly tested only after manufacture of the semiconductor device, there may be a comparatively large amount of rejects. Assembly jigs for constructing this semiconductor device must have a surface which is larger than the surface of the two mounting plates. The space factor is therefore small in assembling as well as the space factor of a furnace in which the soldered connections must be made which renders the manufacture of this circuit arrangement expensive too.

It is an object of the invention to provide a semiconductor device of the above-mentioned type which is eminently suitable for a highly mechanized manufacture, for which a minimum quantity of material may be sufficient so that small dimensions are obtained with the result that the semiconductor device can be manufactured at low cost. To achieve this object the circuit arrangement according to the invention comprises a plurality of preassembled diodes which are provided with electrical conductors protruding from the bodies of the diodes to the exterior and located transversely to the longitudinal direction of the electrically conducting leadout wires and connected electrically and mechanically thereto the bodies of the diodes being located between the leadout wires.

The structure of this semiconductor device is eminently suitable for mechanization so that a cheap manufacture can be obtained. A large number of diodes is simultaneously manufactured in a simple jig having a large space factor. The diodes can each be tested so that less satisfactory diodes are not included in the circuit arrangement and a less satisfactory diode will not cause the finished semiconductor device to be rejected. The diodes are formed in such a manner that they can be mechanically handled without risk of damage and that they can easily be tested electrically. The leadout wires are introduced into a holder in a large number, out to size and bent and they remain in this holder until the entire buildup of the semiconductor device is completed. These holders may be moved along a track to different stations where operations are carried out. At one station a diode is fed to a gripping device and the conductors are cut to length, whereafter the gripping device places the diode with its conductors in the correct positions on two leadout wires. Subsequently, the conductors of this diode are mechanically and electrically connected to the wires at this station. At a subsequent station a following diode is mounted in a similar manner. If all diodes are secured to the leadout wires, the different circuit arrangements included in the holder are enveloped by a synthetic plastics material, whereafter the finished products are removed from the holder. The structure of the semiconductor device according to the invention renders this far advanced mechanization possible with simple means, the cost of production being considerably lower than that for the conventional manual assembly. The heat developed in the circuit arrangement is dissipated by fairly thick wires, so that no large mounting plates incorporated in the synthetic plastics material are required for the dissipation of heat. The dimensions of the semiconductor devices according to the invention may therefore be smaller than the known ones and the cost of material is lower.

In one embodiment according to the invention at least a few leadout wires at an area located within the envelope have a kinked part or bend located in the plane of the wires, the bodies of the diodes being located between those parts of juxtaposed leadout wires, which are further remote from one another than the parts protruding from the envelope. In this manner the length of the conductors of the diodes need not be taken too small, so that the diodes cannot substantially be damaged while connecting the conductors to the leadout wires. In this case the distance between the wires protruding from the envelope may still have a desired size. The leadout wires which are not kinked may be provided with an protuberance so that both the kinks and the protuberance prevent external forces on the leadout wires from propagating to the connections with the conductors. The leadout wires will preferably be located at distances which are suitable for assembly in printed circuit boards having apertures at standardized distances. Since the leadout wires are chosen to be comparatively thick and rigid, a mechanical assembly in printed circuit boards can readily be performed while the dissipation of heat by the wires is sufficiently large.

In a further embodiment according to the invention at least one of the leadout wires has a spherically part which extends transversely to the plane in which the wires are mainly located, one of the conductors of a diode crossing this leadout wire free from contact at the area of the spherical part and leading towards an adjacent leadout wire.

In a preferred embodiment according to the invention the conductors of the diodes and the leadout wires consist of copper and they are connected together by means of a resistance weld. This manner of connection is eminently suitable for mechanization and can be carried out in a simple manner.

According to the invention the preassembled diodes are preferably provided with an envelope consisting of a synthetic plastics material. This greatly facilitates handling of these diodes during electrical testing, cutting the conductors to length and during transport, while the risks of damage are greatly reduced.

In order that the invention may be readily carried into effect, a few embodiments thereof will now be described in detail by way of example with reference of the accompanying diagrammatic drawing in which.

Figure 1:
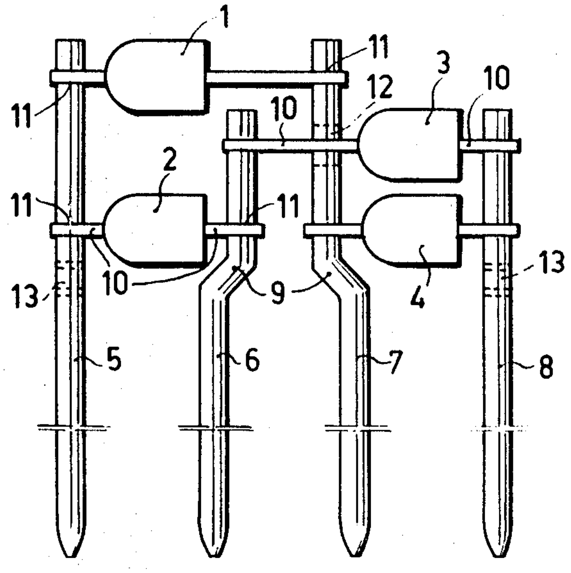
FIG. 1 shows a semiconductor device in which the diodes are included in a Gratz rectifier circuit.

The embodiment shown in a Gratz rectifier circuit which, as is generally known, is used for rectification of an AC voltage. FIG. 1 shows this circuit arrangement which has four diodes 1, 2, 3 and 4 and four leadout wires 5, 6, 7 and 8. THe leadout wires 5 and 7 have a kinked part or bend 9, so that a larger space between the leadout wires is obtained for the bodies of the diodes. The conductors 10 of the diodes are mechanically and electrically connected to the leadout wires by means of a resistance weld, the connections 11 being provided in such a manner that a Gratz rectifier circuit is obtained. The leadout wire 7 has a curved part 12 (see also FIG. 4). Thus it is possible that a conductor of diode 3 can cross this leadout wire 7 free from contact so as to be connected to the leadout wire 6.

Figure 4:
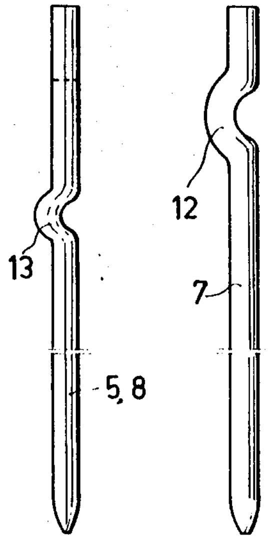
FIG. 4 shows two leadout wires one of which has a small protuberance and the other has a spherical part.

The leadout wires 5 and 8 are furthermore provided with an protuberance 13 (see also FIG. 4). These protuberances and also the kinked parts 9 ensure that external forces on the leadout wires are not passed on to the connections 11.

Figure 2:
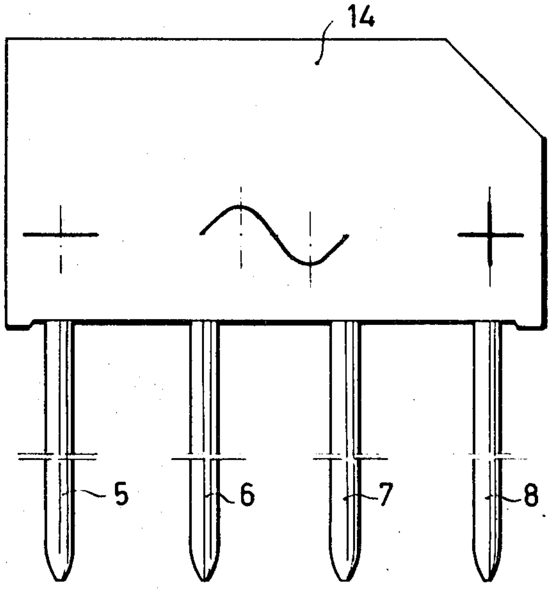
FIGS. 2 and 3 shows this semiconductor device provided with an envelope of synthetic plastics material.
Figure 3:
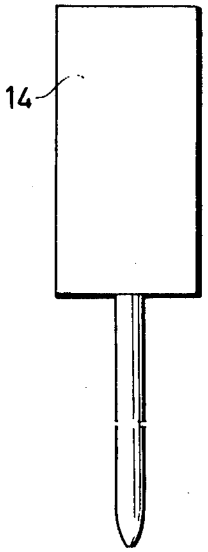

FIGS. 2 and 3 show the semiconductor device according to the invention provided with an envelope 14 of synthetic plastics material. This envelope also bears an indication to show which leadout wires are connected to the AC voltage and form the positive and the negative terminals of the rectified voltage.

The envelope 14 may have a length of 19 mm., a thickness of 5 mm. and a height of 10 mm. The leadout wires have been chosen to be fairly thick for obtaining a satisfactory dissipation of heat and they have a thickness of 1 mm. The leadout wires are located at a mutual distance which corresponds to the standardized distance between apertures in the printed circuit assembly board. The height of the semiconductor device is also adapted to a standardized height of 10 mm. for components to be secured to an assembly board. In the embodiment of the small outer dimensions shown a rectifier of the Gratz type is obtained which is equal to many larger known embodiments as regards electrical performance.

It will be evident that the present invention is not limited to the embodiment shown. Thus, for example, all four leadout wires may have a kink 9. Furthermore, the longitudinal directions of the diode need not be at right angles to the leadout wires. The welded connections may alternatively be substituted for different connections.

The semiconductor device according to the invention is neither limited to a Gratz rectifier circuit. Different semiconductor devices having a circuit arrangement of diodes are also within the scope of the invention such as, for example, a ring modulator etc.

What is claimed is:

1. A semiconductor device comprising a plurality of separately packaged diodes each having at least two extending conductors, at least three substantially parallel spaced stiff leadout wires arranged so as to extend substantially in the same plane, said leadout wires being substantially thicker than the diode conductors, each of said diode packages being located wholly between portions of the leadout wires at one end with the diode conductors extending substantially transversely to the longitudinal directions of the leadout wires and with each of the diode conductors connected electrically and mechanically to a leadout wire, at least one of the leadout wires having a bend located in the wire plane and between the end portions such that the said one end portion spacing to an adjacent leadout wire is larger than the corresponding spacing of their other ends, the diode packages being connected across the said one end portions, at least one of the leadout wires having a curved portion extending transversely to the plane of the wires and a diode conductor passing through the recess formed by the curve, all of the leadout wires lacking a bend being provided with a protuberance, the electrically connected diodes and leadout wires forming a circuit arrangement, and an envelope of synthetic plastic material surrounding the diode packages and the wire end portions connected to the diode conductors leaving the other ends of the leadout wires protruding therefrom to serve as external terminals of the circuit arrangement.

2. A semiconductor device as set forth in claim 1 wherein the leadout wires are rigid, the other ends of the leadout wires are uniformly spaced apart, and the diode conductors are resistance-welded to the leadout wires.